US009564858B2

(12) United States Patent
Nasu et al.

(10) Patent No.: US 9,564,858 B2
(45) Date of Patent: Feb. 7, 2017

(54) PARALLEL RESONANT CIRCUIT

(71) Applicant: SOCIONEXT INC., Kanagawa (JP)

(72) Inventors: Takafumi Nasu, Osaka (JP);
Shinichiro Uemura, Osaka (JP);
Atsushi Ohara, Shiga (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/016,970

(22) Filed: Feb. 5, 2016

(65) Prior Publication Data
US 2016/0156315 A1 Jun. 2, 2016

Related U.S. Application Data

(63) Continuation of application No. PCT/JP2014/002141, filed on Apr. 15, 2014.

(30) Foreign Application Priority Data

Aug. 8, 2013 (JP) ................................. 2013-164841

(51) Int. Cl.
*H03F 3/04* (2006.01)
*H01P 7/00* (2006.01)
(Continued)

(52) U.S. Cl.
CPC ........... *H03F 1/0205* (2013.01); *H03F 1/3211* (2013.01); *H03F 3/191* (2013.01);
(Continued)

(58) Field of Classification Search
None
See application file for complete search history.

(56) References Cited

U.S. PATENT DOCUMENTS 3,775,577 A * 11/1973 Peters, Jr. .............. H02H 7/122
219/626
6,462,962 B1 * 10/2002 Cuk ....................... H02M 1/34
363/131
(Continued)

FOREIGN PATENT DOCUMENTS

JP   2006-325163 A   11/2006
JP   2008-512926 A    4/2008
(Continued)

OTHER PUBLICATIONS

Kanazawa et al., "A 130M to 1GHz Digitally Tunable RF LC-Tracking Filter for CMOS RF receivers," IEEE Asian Solid-State Circuits Conference, Nov. 3-5, 2008, pp. 469-472.
(Continued)

*Primary Examiner* — Patricia T Nguyen
(74) *Attorney, Agent, or Firm* — McDermott Will & Emery LLP

(57) ABSTRACT

A parallel resonant circuit with excellent distortion and saturation characteristics is provided at low power consumption. A first power-supply voltage is applied to the parallel resonant circuit. In the parallel resonant circuit, a variable resistor includes one or more parallel-connected branches. Each of the branches includes a series circuit of a resistor and a MOS switch. A second power supply supplies power of control signals applied to respective gates of the MOS switches, and supplies back gate voltages to the MOS switches. A power-supply voltage of the second power supply is higher than the first power-supply voltage.

20 Claims, 9 Drawing Sheets

(51) Int. Cl.
  *H03F 1/02* (2006.01)
  *H03F 3/191* (2006.01)
  *H03H 5/00* (2006.01)
  *H03J 5/02* (2006.01)
  *H03F 1/32* (2006.01)
  *H03F 3/45* (2006.01)
  *H03F 3/193* (2006.01)
  *H03H 11/04* (2006.01)

(52) U.S. Cl.
  CPC ......... *H03F 3/193* (2013.01); *H03F 3/45179* (2013.01); *H03F 3/45475* (2013.01); *H03H 5/00* (2013.01); *H03J 5/02* (2013.01); *H03F 2200/294* (2013.01); *H03F 2200/451* (2013.01); *H03F 2203/45394* (2013.01); *H03F 2203/45631* (2013.01); *H03F 2203/45634* (2013.01); *H03F 2203/45638* (2013.01); *H03F 2203/45644* (2013.01); *H03F 2203/45658* (2013.01); *H03F 2203/45688* (2013.01); *H03F 2203/45694* (2013.01); *H03F 2203/45696* (2013.01); *H03F 2203/45712* (2013.01); *H03F 2203/45714* (2013.01); *H03F 2203/45718* (2013.01); *H03F 2203/45726* (2013.01); *H03H 11/04* (2013.01); *H03J 2200/10* (2013.01)

(56) References Cited

U.S. PATENT DOCUMENTS

| 2002/0190796 A1* | 12/2002 | Park ..................... H03F 1/223 330/285 |
| 2007/0035347 A1* | 2/2007 | Sasaki .................... H03L 7/107 331/16 |
| 2008/0012643 A1 | 1/2008 | Duperray |
| 2012/0250382 A1* | 10/2012 | Frattini ............. H02M 3/33569 363/126 |
| 2013/0137383 A1* | 5/2013 | Kobayashi ................ H03F 1/34 455/77 |
| 2013/0277333 A1* | 10/2013 | Misra ........................ C23F 1/08 216/61 |
| 2015/0303806 A1* | 10/2015 | Madsen ................ H02M 3/158 323/271 |

FOREIGN PATENT DOCUMENTS

| JP | 2009-284142 A | 12/2009 |
| WO | 2007/099622 A1 | 9/2007 |

OTHER PUBLICATIONS

International Search Report issued in Application No. PCT/JP2014/002141 dated Jul. 22, 2014, with English translation.

* cited by examiner

PARALLEL RESONANT CIRCUIT

CROSS-REFERENCE TO RELATED APPLICATIONS

This is a continuation of international Application No. PCT/JP2014/002141 filed on Apr. 15, 2014, which claims priority to Japanese Patent Application No. 2013-164841 filed on Aug. 8, 2013. The entire disclosures of these applications are hereby incorporated by reference.

BACKGROUND

The present disclosure relates to parallel resonant circuits utilized, for example, for tuner systems.

Tuner systems receive transmission signals of a plurality of channels, select desired channels, and demodulate the signals of the desired channels. Such tuner systems need to have low distortion characteristics. For example, Japan's Integrated Services Digital Broadcasting for Terrestrial Television Broadcasting (ISDB-T) has in total 40 channels, from Channel 13 (473.143 MHz) to Channel 52 (707.143 MHz). Each channel has a signal bandwidth of 6 MHz. Tuner systems also need to have disturbance wave characteristics of 50 dBc or more in accordance with an input level of an interfered channel at each received channel.

In order to achieve such reception characteristics, most tuner systems remove interfering waves using a parallel resonant circuit having variable center frequencies according to received channels at a low noise amplifier at a first stage. On the other hand, low power consumption is also important for tuner systems for mobile terminals.

A typical amplifier circuit includes, as a load of a transconductance amplifier, a parallel resonant circuit formed by connecting an inductor, a variable capacitor, and a variable resistor in parallel. The variable resistor is formed by connecting a plurality of branches in parallel. Each branch includes a series circuit of a resistor and a MOS switch. The variable capacitor is also formed by connecting a plurality of branches in parallel. Each branch includes a series circuit of a capacitor and a MOS switch. See, for example, Y. Kanazawa et al., A 130M to 1 GHz Digitally Tunable RF LC-Tracking Filter for CMOS RF Receivers, IEEE Asian Solid-State Circuits Conference, Nov. 2008, pp.469-472.

SUMMARY

As described above, if an amplifier circuit includes a parallel resonant circuit as a load of a transconductance amplifier, an output voltage Vo of the amplifier circuit is formed by superimposing an AC component Vac on a power-supply voltage Vdd of the amplifier circuit. Vdd is input to a gate of a PMOS switch of the variable resistor being in an off state. In this case, the relation between the output voltage Vo and the gate-source voltage Vgs of the PMOS switch in the off state is as follows.

$$Vgs=Vdd-Vo=Vdd-(Vdd+Vac)=-Vac$$

However, if the AC component Vac is equal to or higher than a threshold voltage Vth of a transistor being the PMOS switch, the PMOS switch is temporarily turned on from the off state. This allows output impedance to largely fluctuate, thereby degrading the distortion and saturation characteristics of the amplifier circuit. In addition, a forward bias voltage is applied not only to a voltage between the gate and a source, but also to a parasitic diode between the source and a back gate to cause fluctuation in the impedance. This also degrades the distortion and saturation characteristics. This problem becomes more significant, if a transistor with a low threshold voltage Vth is used to reduce power consumption.

The present disclosure provides a parallel resonant circuit with excellent distortion and saturation characteristics at low power consumption.

According to an aspect of the present disclosure, a parallel resonant circuit is formed by connecting an inductor, a capacitor, and a variable resistor in parallel, and connected to a first power supply. In the parallel resonant circuit, the variable resistor includes one or more parallel-connected branches. Each of the branches includes a series circuit of a resistor and a MOS switch. A second power supply supplies power of control signals applied to respective gates of the MOS switches, and supplies back gate voltages to the MOS switches. A power-supply voltage of the second power supply is higher than a power-supply voltage of the first power supply.

According to another aspect of the present disclosure, a parallel resonant circuit is formed by connecting an inductor and a variable capacitor in parallel, and connected to a first power supply. The variable capacitor is formed by connecting a plurality of branches in parallel. Each of the branches includes a series circuit of a capacitor and a MOS switch. A second power supply supplies power of control signals applied to respective gates of the MOS switches, and supplies back gate voltages to the MOS switches. A power-supply voltage of the second power supply is higher than a power-supply voltage of the first power supply.

According to the present disclosure, the MOS switches have higher gate and back gate voltages to maintain the off states, thereby improving the distortion and saturation characteristics of the parallel resonant circuit.

DETAILED DESCRIPTION

Embodiments of the present disclosure will now be described with reference to the drawings.

First Embodiment

Figure 1:
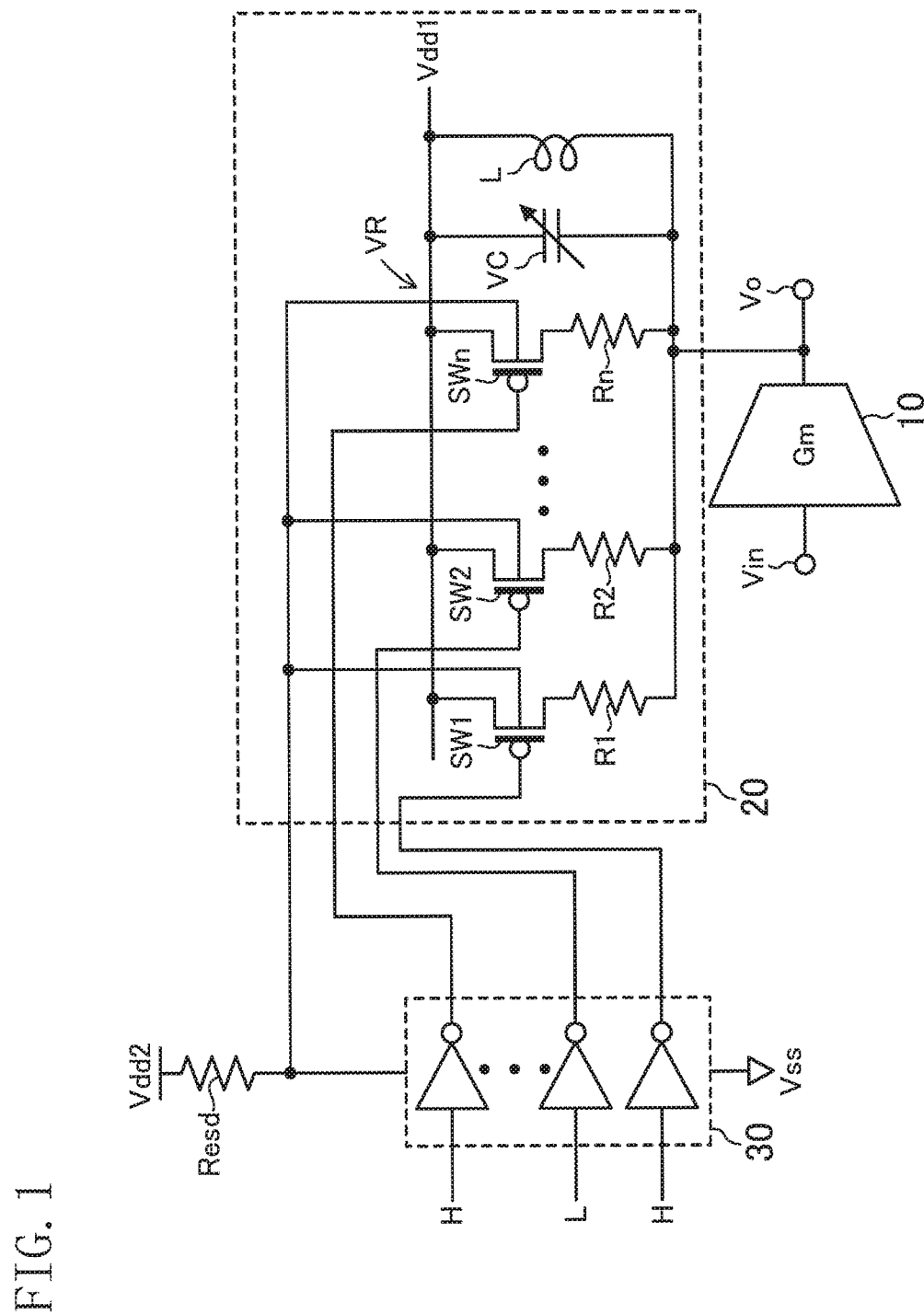
FIG. 1 is a circuit diagram of an amplifier circuit including, as a load of a transconductance amplifier, a parallel resonant circuit according to a first embodiment of the present disclosure.

FIG. 1 is a circuit diagram of an amplifier circuit including, as a load of a transconductance amplifier, a parallel resonant circuit according to a first embodiment of the present disclosure. The amplifier circuit of FIG. 1 includes a transconductance amplifier 10, a parallel resonant circuit 20, and a resistance value control circuit 30. Vin is an input voltage of the amplifier circuit. Vo is an output voltage of the amplifier circuit.

The parallel resonant circuit 20 is formed by connecting an inductor L, a variable capacitor VC, and a variable resistor VR in parallel, and interposed between a power-supply voltage Vdd1 of a first power supply (hereinafter referred to as a first power-supply voltage) and Vo. The variable resistor VR includes n parallel-connected branches, where n is an integer of 1 or greater. A first branch includes a series circuit of a PMOS switch SW1 and a resistor R1. A second branch includes a series circuit of a PMOS switch SW2 and a resistor R2. An n-th branch includes a series circuit of a PMOS switch SWn and a resistor Rn. The resistance values of n resistors R1, R2, . . . , Rn are weighted differently.

A power-supply voltage Vdd2 of a second power supply (hereinafter referred to as a second power-supply voltage) is applied to the resistance value control circuit 30 via an electro-static discharge (ESD) protection resistor Resd to generate control signals to be applied to respective gates of the PMOS switches SW1, SW2, . . . , SWn. Vdd2 is also applied to respective back gates of the PMOS switches SW1, SW2, . . . , SWn via the ESD protection resistor Resd. The transistors being the PMOS switches SW1, SW2, . . . , SWn have higher breakdown voltages than MOS transistors forming the transconductance amplifier 10 to improve ESD protection. Vdd2 is higher than Vdd1. For example, Vdd2 is 3.3 V and Vdd1 is 1.8 V.

As shown in FIG. 1, it is assumed that a group of control signals for turning off only the PMOS switch SW2 of the second branch is applied to the resistance value control circuit 30. The output voltage Vo of the amplifier circuit is formed by superimposing an AC component Vac on Vdd1. The gate-source voltage Vgs of the PMOS switch SW2 being in an off state is represented by the following equations.

$$Vgs = Vdd2 - Vo$$
$$= Vdd2 - (Vdd1 + Vac)$$
$$= -Vac + (Vdd2 - Vdd1)$$

In this manner, the PMOS switch SW2 is less easily turned on than a typical MOS switch by the difference (Vdd2−Vdd1) between the two power-supply voltages. This results in improvement in the distortion and saturation characteristics of the amplifier circuit.

Not to turn on a parasitic diode between the source and the back gate, Vdd2 is applied to the respective back gates of the PMOS switches SW1, SW2, . . . , SWn.

The MOS switches are not necessarily connected in series to all the n resistors R1, R2, . . . , Rn.

Figure 2:
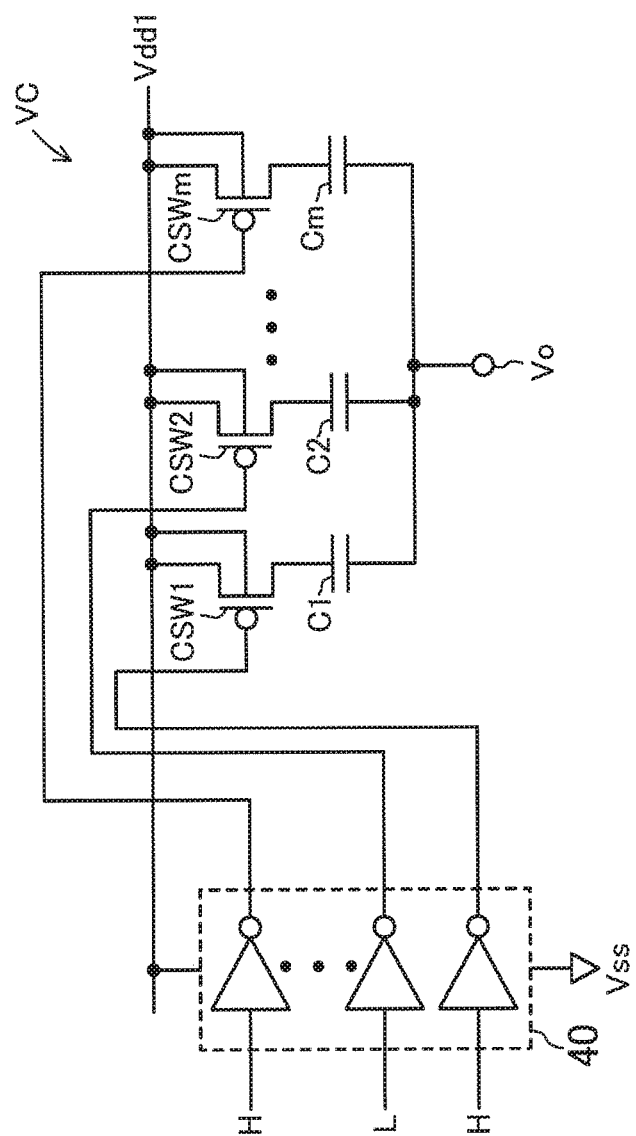
FIG. 2 is a circuit diagram illustrating a specific example configuration of a variable capacitor of FIG. 1.

FIG. 2 is a circuit diagram illustrating a specific example configuration of the variable capacitor VC of FIG. 1. The variable capacitor VC of FIG. 2 is interposed between Vdd1 and Vo, and includes m parallel-connected branches, where m is an integer of two or greater. A first branch includes a series circuit of a PMOS switch CSW1 and a capacitor C1. A second branch includes a series circuit of a PMOS switch CSW2 and a capacitor C2. An m-th branch includes a series circuit of a PMOS switch CSWm and a capacitor Cm. The capacitance values of the m capacitors C1, C2, . . . , Cm are weighted differently. Control signals applied to respective gates of the PMOS switches CSW1, CSW2, . . . , CSWm are generated by a capacitance value control circuit 40. Vdd1 is a power-supply voltage of the capacitance value control circuit 40, and is also applied to respective back gates of the PMOS switches CSW1, CSW2, . . . , CSWm.

The configuration of FIG. 2 allows the parallel resonant circuit 20 to have a variable resonance frequency. The MOS switches are not necessarily connected in series to all the m capacitors C1, C2, . . . , Cm.

Figure 3:
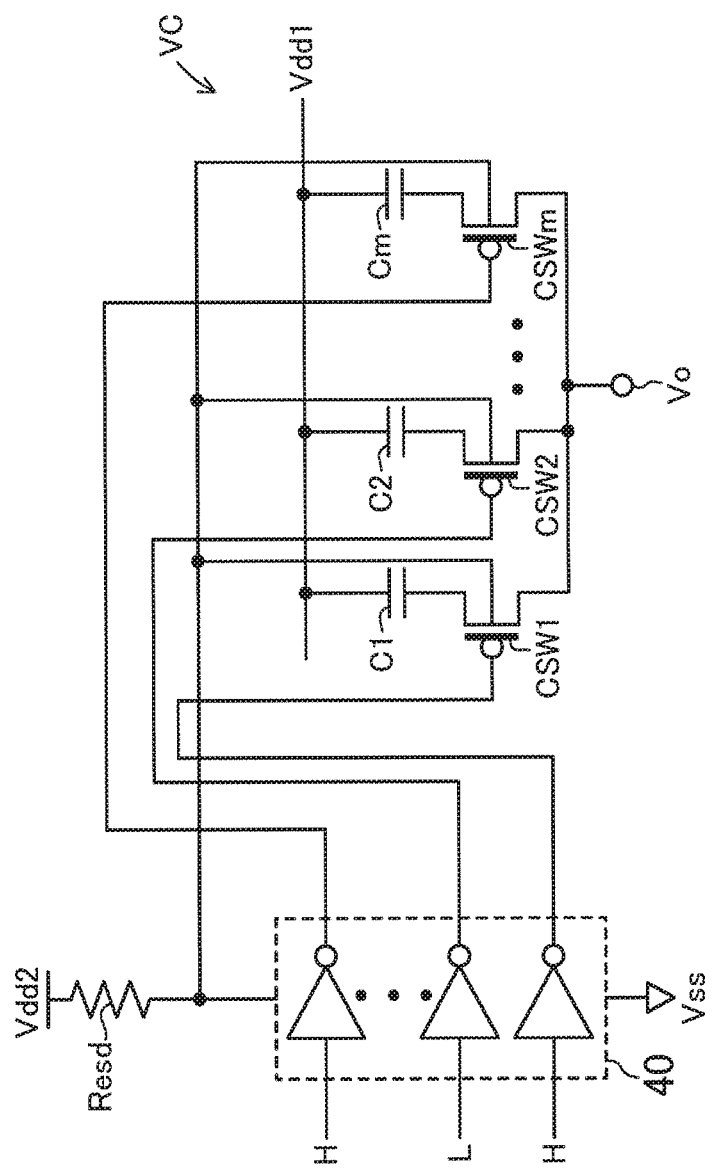
FIG. 3 is a circuit diagram illustrating another specific example configuration of the variable capacitor of FIG. 1.

FIG. 3 is a circuit diagram illustrating another specific example configuration of the variable capacitor VC of FIG. 1. In FIG. 3, the positions of PMOS switches CSW1, CSW2, . . . , CSWm and the capacitors C1, C2, . . . , Cm are interchanged as compared to FIG. 2. Like the resistance value control circuit 30 described above, Vdd2, where Vdd2 is higher than Vdd1, is applied to the capacitance value control circuit 40 via the ESD protection resistor Resd to generate control signals to be applied to respective gates of the PMOS switches CSW1, CSW2, . . . , CSWm. Vdd2 is also applied to respective back gates of the PMOS switches CSW1, CSW2, . . . , CSWm via the ESD protection resistor Resd. The transistors being the PMOS switches CSW1, CSW2, . . . , CSWm are high-breakdown voltage MOS transistors.

The configuration of FIG. 3 allows for reducing deterioration in the distortion and saturation characteristics caused by the MOS switches of the variable capacitor VC.

Figure 4:
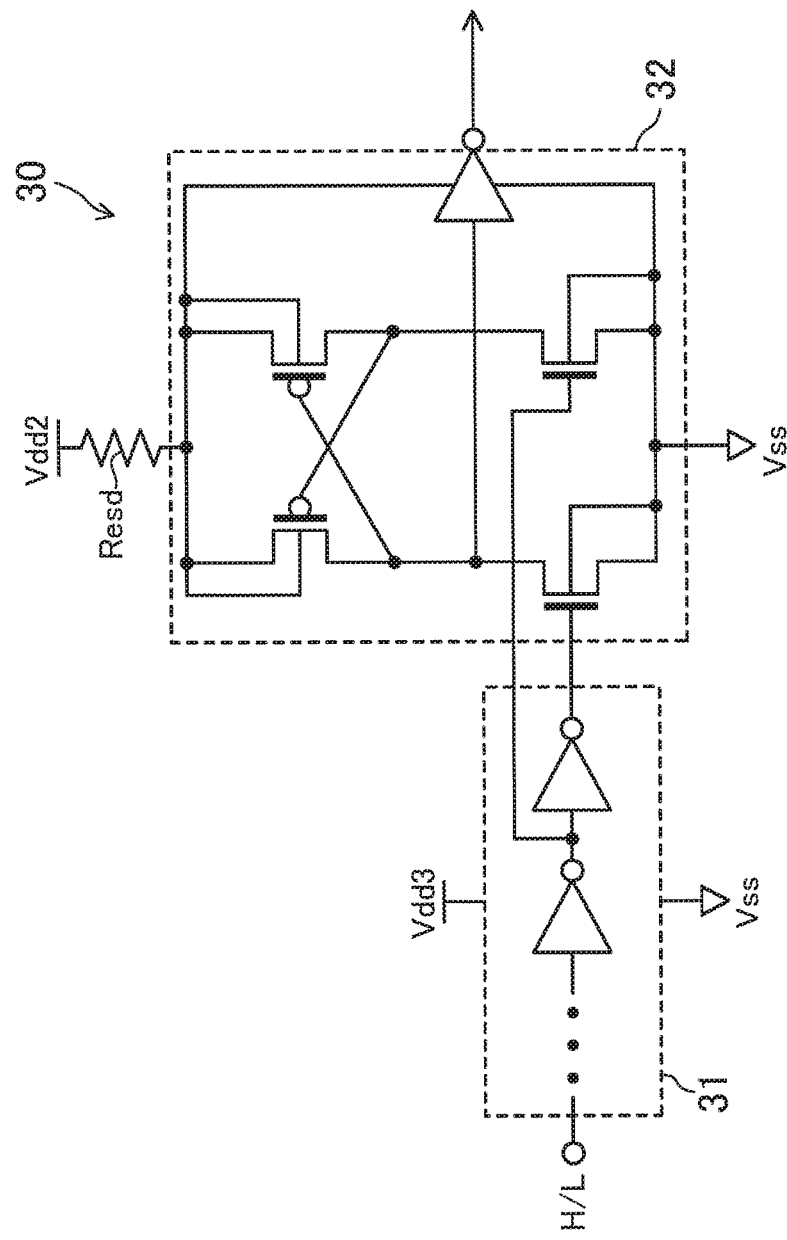
FIG. 4 is a circuit diagram illustrating a specific example configuration of a resistance value control circuit of FIG. 1.

FIG. 4 is a circuit diagram illustrating a specific example configuration of the resistance value control circuit 30 of FIG. 1. The resistance value control circuit 30 of FIG. 4 includes a logic circuit 31 and a level shifter 32. The logic circuit 31 is operated by a power-supply voltage of a third power supply (hereinafter referred to as a third power-supply voltage) Vdd3. The level shifter 32 is operated by Vdd2 based on outputs of the logic circuit 31, and outputs control signals of the respective gates of the PMOS switches SW1, SW2, . . . , SWn. Vdd3 is equal to or lower than Vdd1. For example, Vdd3 is 1.2 V.

The configuration of FIG. 4 enables low power consumption. The capacitance value control circuit 40 of FIG. 3 may have a configuration similar to that of FIG. 4.

Second Embodiment

Figure 5:
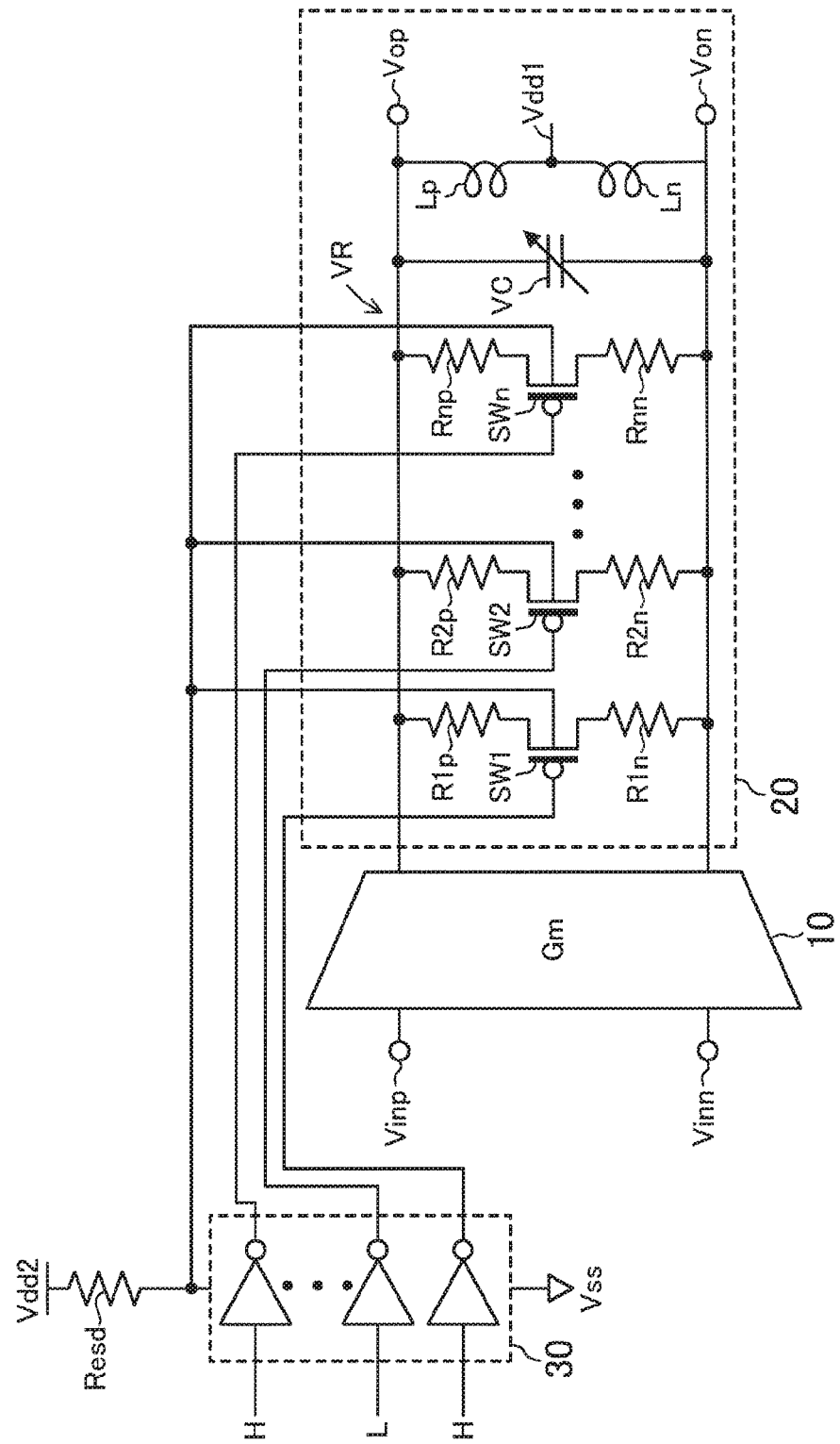
FIG. 5 is a circuit diagram of an amplifier circuit including, as a load of a differential transconductance amplifier, a parallel resonant circuit according to a second embodiment of the present disclosure.

FIG. 5 is a circuit diagram of an amplifier circuit including, as a load of a differential transconductance amplifier, a parallel resonant circuit according to a second embodiment of the present disclosure. Vinp and Vinn are differential input voltages of the amplifier circuit. Vop and Von are differential output voltages of the amplifier circuit.

In FIG. 5, a parallel resonant circuit 20 has a differential configuration in accordance with the transconductance amplifier 10 having the differential configuration. First, a positive inductor Lp is interposed between Vop and Vdd1, and a negative inductor Ln is interposed between Vdd1 and Von. A variable resistor VR includes n parallel-connected branches, where n is an integer of 1 or greater. A first branch includes a series circuit of a resistor R1p, a PMOS switch SW1, and a resistor R1n. A second branch includes a series circuit of a resistor R2p, a PMOS switch SW2, and a resistor R2n. An n-th branch includes a series circuit of a resistor Rnp, a PMOS switch SWn, and a resistor Rnn. The other configurations are similar to those of FIG. 1. Vdd2, which is higher than Vdd1, is applied to the resistance value control circuit 30 via an ESD protection resistor Resd to generate control signals to be applied to respective gates of the PMOS switches SW1, SW2, ..., SWn. Vdd2 is also applied to respective back gates of the PMOS switches SW1, SW2, ..., SWn via the ESD protection resistor Resd. The transistors being the PMOS switches SW1, SW2, ..., SWn are high-breakdown voltage MOS transistors.

In addition to the advantages of the first embodiment, the configuration FIG. 5 improves second-order distortion characteristics and resistance to disturbance noise by employing the differential configuration.

Figure 6:
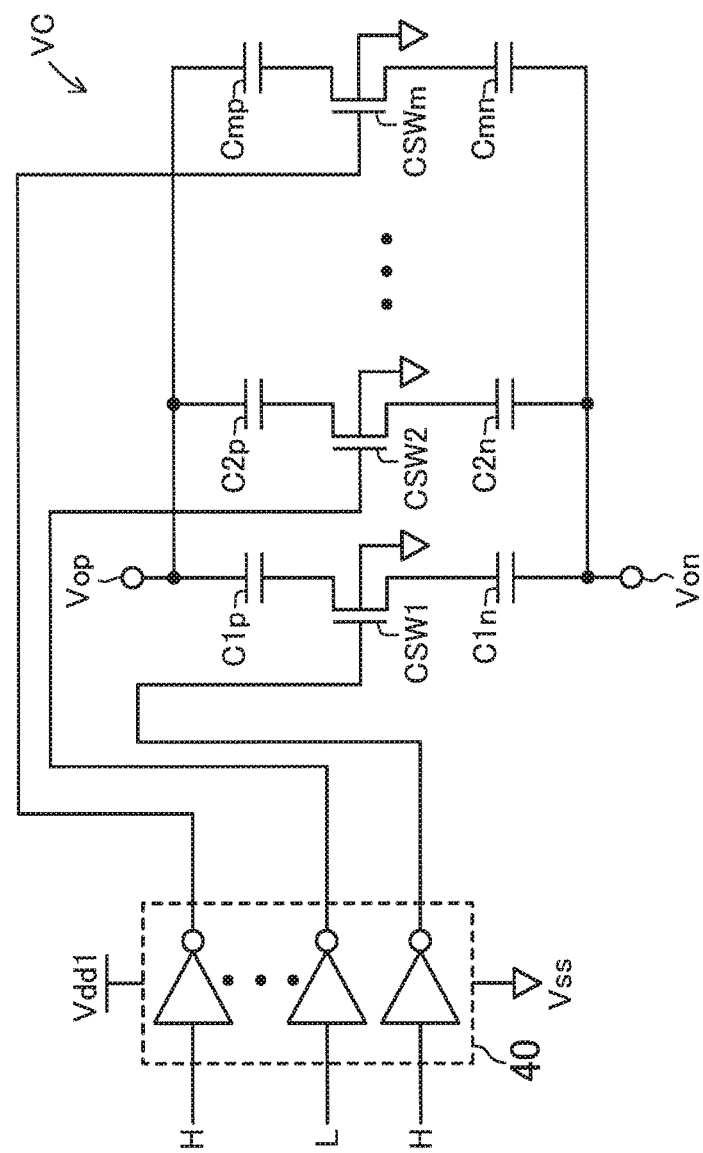
FIG. 6 is a circuit diagram illustrating a specific example configuration of a variable capacitor of FIG. 5.

FIG. 6 is a circuit diagram illustrating a specific example configuration of a variable capacitor VC of FIG. 5. The variable capacitor VC of FIG. 6 is interposed between Vop and Von, and includes m parallel-connected branches, where m is an integer of two or greater. A first branch includes a series circuit of a capacitor C1p, an NMOS switch CSW1, and a capacitor C1n. A second branch includes a series circuit of a capacitor C2p, an NMOS switch CSW2, and a capacitor C2n. An m-th branch includes a series circuit of a capacitor Cmp, an NMOS switch CSWm, and a capacitor Cmn. Other configurations are similar to those of FIG. 2.

Figure 7:
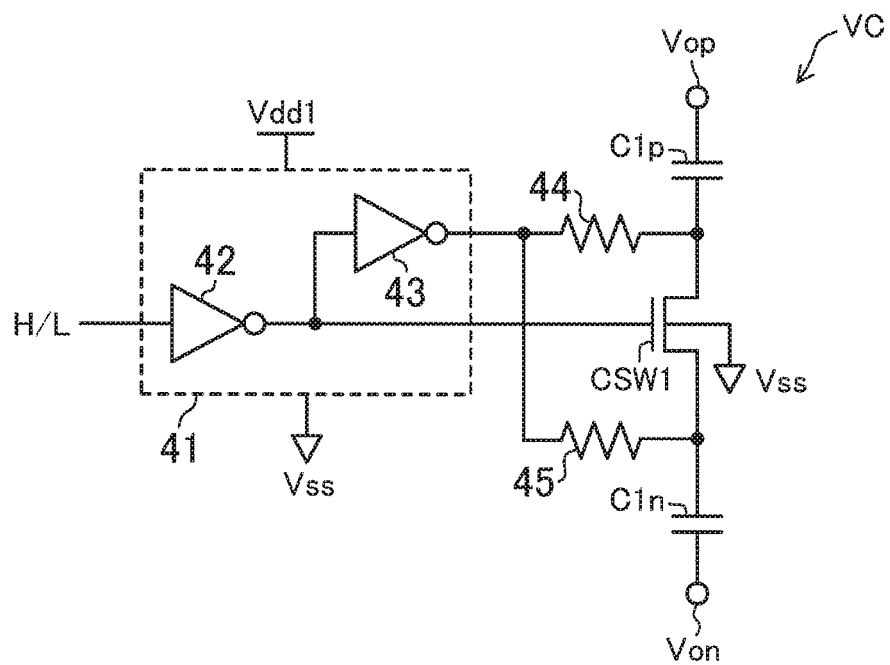
FIG. 7 is a circuit diagram illustrating another specific example configuration of the variable capacitor of FIG. 5.

FIG. 7 is a circuit diagram illustrating another specific example configuration of the variable capacitor VC of FIG. 5. Only a first branch is shown in the figure. The branch shown in FIG. 7 includes a series circuit of a capacitor C1p, an NMOS switch CSW1, and a capacitor C1n as in FIG. 6. In addition, the branch of FIG. 7 includes a bias circuit to reduce the on-resistance of the NMOS switch CSW1. The bias circuit includes a logic circuit 41 and two resistors 44 and 45. The logic circuit 41 includes two-stage inverters 42 and 43. An output of the first-stage inverter 42 is connected to a gate of the NMOS switch CSW1. An output of the second-stage inverter 43 is connected to a drain of the NMOS switch CSW1 via a resistor 44. The output of the second-stage inverter 43 is also connected to a source of the NMOS switch CSW1 via a resistor 45. A ground voltage Vss is applied to a back gate of the NMOS switch CSW1.

When the bias circuit operates to turn on the NMOS switch CSW1, an H voltage is applied to the gate, and an L voltage is applied to the source and the drain to reduce on-resistance. On the other hand, when the NMOS switch CSW1 is turned off, an L voltage is applied to the gate, and an H voltage is applied to the source and the drain to increase off-resistance.

The configuration of FIG. 7 reduces on-resistance of the MOS switches of the variable capacitor VC, thereby exhibiting steep filter characteristics. Furthermore, the distortion and saturation characteristics are not deteriorated by the MOS switches.

Figure 8:
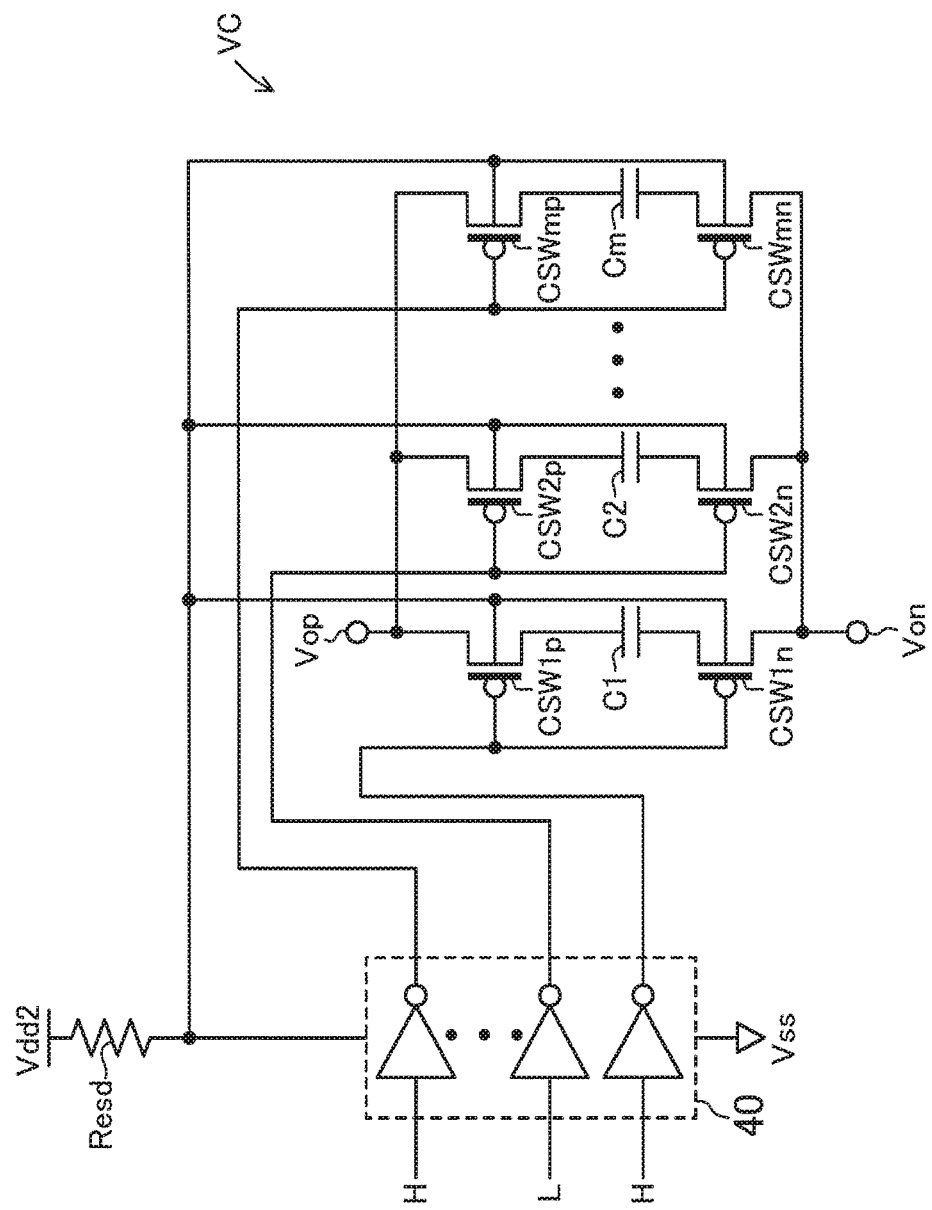
FIG. 8 is a circuit diagram illustrating yet another specific example configuration of the variable capacitor of FIG. 5.

FIG. 8 is a circuit diagram illustrating yet another specific example configuration of the variable capacitor VC of FIG. 5. The variable capacitor VC of FIG. 8 is interposed between Vop and Von, and includes m parallel-connected branches, where m is an integer of two or greater. A first branch includes a series circuit of a PMOS switch CSW1p, a capacitor C1, and a PMOS switch CSW1n. A second branch includes a series circuit of a PMOS switch CSW2p, a capacitor C2, and a PMOS switch CSW2n. An m-th branch includes a series circuit of a PMOS switch CSWmp, a capacitor Cm, and a PMOS switch CSWmn. Other configurations are similar to those of FIG. 3. Vdd2, where Vdd2 is higher than Vdd1, is applied to a capacitance value control circuit 40 via the ESD protection resistor Resd to generate control signals to be applied to respective gates of the PMOS switches CSW1p, CSW2p, ..., CSWmp as well as CSW1n, CSW2n, ..., CSWmn. Vdd2 is also applied to respective back gates of the PMOS switches CSW1p, CSW2p, ..., CSWmp as well as CSW1n, CSW2n, ..., CSWmn via the ESD protection resistor Resd. The transistors being the PMOS switches CSW1p, CSW2p, ..., CSWmp as well as CSW1n, CSW2n, ..., CSWmn are high-breakdown voltage MOS transistors.

Figure 9:
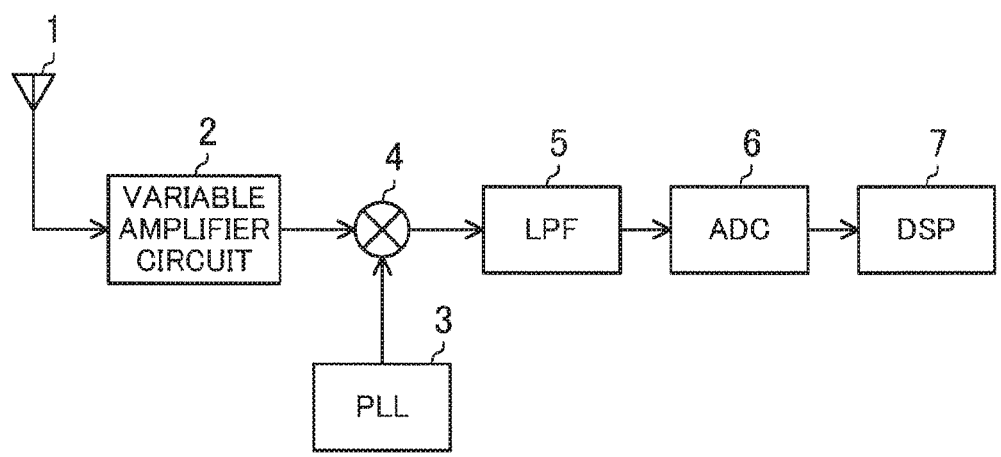
FIG. 9 is a block diagram of a tuner system including, as a variable amplifier circuit, the amplifier circuit of FIG. 1 or 5.

FIG. 9 is a block diagram of a tuner system including the amplifier circuit of FIG. 1 or 5 as a variable amplifier circuit. The tuner system of FIG. 9 includes an antenna 1, a variable amplifier circuit 2, which is the amplifier circuit of FIG. 1 or 5, a phase-locked loop (PLL) 3, a mixer 4, a low pass filter (LPF) 5, an analog-to-digital converter (ADC) 6, and a digital signal processor (DSP) 7. The configuration of FIG. 9 provides a tuner system with excellent disturbance wave characteristics.

As above, the first and second embodiments have been described as examples of the technique disclosed in the present application. However, the present application is not limited thereto. As other embodiments, modifications, replacements, additions, and omissions may be made as appropriate. Further embodiments may include combinations of the elements described above.

As described above, the parallel resonant circuit according to the present disclosure easily maintains off states of MOS switches to improve distortion and saturation characteristics, and is thus useful, for example, as a tracking filter for a tuner system.

What is claimed is:

1. A parallel resonant circuit formed by connecting an inductor, a capacitor, and a variable resistor in parallel and connected to a first power supply, wherein
    the variable resistor includes one or more parallel-connected branches,
    each of branches includes a series circuit of a resistor and a MOS switch,
    a second power supply supplies power of control signals applied to respective gates of the MOS switches, and supplies back gate voltages to the MOS switches, and
    a power-supply voltage of the second power supply is higher than a power-supply voltage of the first power supply.

2. The parallel resonant circuit of claim 1, wherein
    each of the MOS switches has a higher breakdown voltage than a MOS transistor operated by the power-supply voltage of the first power supply.

3. The parallel resonant circuit of claim 1, further comprising an ESD protection resistor between the second power supply and back gates of the MOS switches.

4. The parallel resonant circuit of claim 1, wherein
    a control circuit supplies the control signals to the respective gates of the MOS switches,
    the control circuit includes
        a logic circuit operated by a power-supply voltage of a third power supply, and
        a level shifter operated by a power-supply voltage of the second power supply based on an output of the logic circuit, and outputting the control signals, and
    the power-supply voltage of the third power supply is not higher than the power-supply voltage of the first power supply.

5. The parallel resonant circuit of claim 1, wherein
    the capacitor includes a variable capacitor.

6. The parallel resonant circuit of claim 5, wherein
    the variable capacitor is formed by connecting a plurality of branches in parallel, and
    in the variable capacitor, each of the branches includes a series circuit of a capacitor and a MOS switch.

7. The parallel resonant circuit of claim 6, wherein
in the variable capacitor, the second power supply supplies the power of the control signals applied to the respective gates of the MOS switches, and supplies the back gate voltages to the MOS switches.

8. The parallel resonant circuit of claim 7, wherein
in the variable capacitor, each of the MOS switches has a higher breakdown voltage than a MOS transistor operated by the power-supply voltage of the first power supply.

9. The parallel resonant circuit of claim 1, wherein
the parallel resonant circuit of claim 1 has a differential configuration.

10. The parallel resonant circuit of claim 9, wherein
the capacitor includes a variable capacitor.

11. The parallel resonant circuit of claim 10, wherein
the variable capacitor is formed by connecting a plurality of branches in parallel, and
in the variable capacitor, each of the branches includes a series circuit of a MOS switch and capacitors connected to both terminals of the MOS switch.

12. The parallel resonant circuit of claim 11, wherein
in the variable capacitor, each of the branches further includes a bias circuit reducing on-resistance of the MOS switch.

13. The parallel resonant circuit of claim 10, wherein
the variable capacitor is formed by connecting a plurality of branches in parallel, and
in the variable capacitor, each of the branches includes a series circuit of a capacitor and MOS switches connected to both terminals of the capacitor.

14. An amplifier circuit comprising the parallel resonant circuit of claim 1 as a load of a transconductance amplifier.

15. A tuner system comprising the amplifier circuit of claim 14.

16. A parallel resonant circuit formed by connecting an inductor and a variable capacitor in parallel and connected to a first power supply, wherein
the variable capacitor is formed by connecting a plurality of branches in parallel,
each of the branches includes a series circuit of a capacitor and a MOS switch,
a second power supply supplies power of control signals applied to respective gates of the MOS switches, and supplies back gate voltages to the MOS switches, and
a power-supply voltage of the second power supply is higher than a power-supply voltage of the first power supply.

17. The parallel resonant circuit of claim 16, further comprising:
a resistor connected in parallel with the inductor and the variable capacitor.

18. The parallel resonant circuit of claim 17, wherein
the resistor includes a variable resistor.

19. An amplifier circuit comprising the parallel resonant circuit of claim 16 as a load of a transconductance amplifier.

20. A tuner system comprising the amplifier circuit of claim 19.

* * * * *